United States Patent [19]

Spicer et al.

[11] 4,170,687

[45] Oct. 9, 1979

[54] PLANOGRAPHIC PRINTING PLATE FOR DRY PRINTING

[75] Inventors: Leonard A. Spicer, Ilford; Derek J. McGee, Henham; Ian H. Elson, Northwich, all of England

[73] Assignee: Gestetner Limited, London, England

[21] Appl. No.: 837,864

[22] Filed: Sep. 29, 1977

[30] Foreign Application Priority Data

Sep. 30, 1976 [GB] United Kingdom ............... 40685/76
Dec. 22, 1976 [GB] United Kingdom ............... 53570/76

[51] Int. Cl.[2] ........................ B32B 27/00; B32B 27/40; B41N 1/00; G03F 7/02

[52] U.S. Cl. ........................................ 428/421; 96/33; 96/36.3; 101/453; 428/423; 428/425; 428/914

[58] Field of Search ........................ 101/450, 455, 453; 96/33, 36, 36.3; 428/421, 423, 425

[56] References Cited

U.S. PATENT DOCUMENTS

| | | | |
|---|---|---|---|
| 3,241,486 | 3/1966 | Greubel et al. | 96/33 |
| 3,677,178 | 7/1972 | Gipe | 96/33 X |
| 3,859,090 | 1/1975 | Yoerger et al. | 96/33 X |
| 3,901,700 | 8/1975 | Yoerger et al. | 96/33 X |
| 3,910,187 | 10/1975 | Cords | 101/450 |
| 3,971,316 | 7/1976 | Schank et al. | 96/33 X |
| 3,975,352 | 8/1976 | Yoerger et al. | 96/33 X |

*Primary Examiner*—Thomas J. Herbert, Jr.
*Attorney, Agent, or Firm*—Cushman, Darby & Cushman

[57] ABSTRACT

Planographic printing plates for use without fountain solution, and especially suitable for imaging with an electrophotographic toner, have a surface containing a fluorinated polyurethane. In use only the image areas accept ink.

13 Claims, No Drawings

PLANOGRAPHIC PRINTING PLATE FOR DRY PRINTING

This invention relates to planographic printing, and in particular to planographic printing systems operated without the use of fountain solution, i.e. in so-called "dry printing."

In conventional planographic printing (lithography), the image on the printing plate is not raised, or only very slightly raised, above the surrounding surface of the plate, and in use the image, which is oleophilic, attracts the greasy printing ink, while the mon-image areas, which are hydrophilic, repel the ink. In order to maintain the non-image areas in a hydrophilic and ink-repellent condition, the plate is periodically wetted with an aqueous mixture, called fountain solution, which serves to prevent pick-up of ink by the non-image areas. Since the application of the fountain solution to the plate requires the provision of special apparatus in the printing machine, and the control of this apparatus calls for a certain amount of judgement and experience on the part of the operator, it is clearly desirable to be able to provide a system of planographic printing in which the need for fountain solution is removed.

One way of doing this is to provide a plate which has a surface which is so repellent to the ink that the latter will not stick to it even if no fountain solution is used. A number of proposals to make plates of this kind have been made, mostly depending upon coating the plate with a layer containing a silicone or a fluorine-compound. Since lithographic inks are oil-based and silicones and fluorine compounds are oleophobic, these proposals have met with a certain amount of success, but there is still substantial room for improvement both in ensuring adequate adhesion of the image to the ink-repelling surface of the plate and in ensuring complete absence of any ink pick-up in the non-image areas.

We have now found that a planographic printing plate for use in a system which does not require the use of fountain solution or other means for maintaining the non-image areas of the plate in a hydrophilic and ink-repellent state, can advantageously be provided with an ink-repellent coating containing a fluorinated polyurethane obtained by reaction of a fluorinated polyol and a non-fluorinated polyol with a polyisocyanate, alone or preferably in admixture with a synthetic, film-forming resin.

The fluorinated polyurethane contains fluorocarbon residues to impart the necessary degree of oleophobicity. It should also contain, generally in the non-fluorinated polyol residues, radicals imparting a degree of affinity for the toner image, for example hydrocarbon residues, e.g. styrene residues. Preferably it contains residues in approximately stoichiometric proportions of (1) a polyol component comprising 50 to 90% by weight of a fluoro-compound of the formula:

$$R_f\text{—}(CH_2)_m\text{—}(OC_6H_4)_n\text{—}A\text{—}N(RX)_2$$

in which $R_f$ is a perfluoroaliphatic radical of at least 3 carbon atoms, m is 0, 1 or 2, n is 0 or 1, A is —$SO_2$— or —CO—, R is alkylene of 2 to 10 carbon atoms, and X is —OH or —$NH_2$ and 50 to 10% by weight of a non-fluorinated polyol, and (2) a polyisocyanate.

The preferred fluoro-compounds of the formula given above are those in which $R_f$ is perfluoroalkenyl having an even number of carbon atoms from 8 to 16, m is 0, n is 1, A is —$SO_2$—, R is ethylene, and X is OH.

Such compounds are described in British patent specification No. 1,404,351.

Other useful compounds are those in which $R_f$ is perfluoroalkyl of 3 to 15 carbon atoms, m is 0, n is 0, A is —$SO_2$—, R is alkylene of 2 to 4 carbon atoms, and X is —OH or —$NH_2$.

The non-fluorinated polyol may be any polyol known for use in making film-forming polyurethanes and is usually a diol. Especially suitable diols are those of the formula:

$$R_1\text{—}N(ROH)_2$$

where $R_1$ is alkyl of 8 to 18 carbon atoms and R is as hereinbefore defined, preferably ethylene. Such compounds are commercially available.

In order to incorporate in the polyurethane residues having affinity for the toner, part or all of the polyol, but usually 5 to 25% by weight, may consist of a polyol containing residues having affinity for the polymer in the toner. Thus when a polystyrene toner is to be used in imaging, the polyol may contain styrene residues. Suitable polyols containing styrene residues are commercially available, and, for example, are styrene/-butadiene copolymers into which hydroxyl groups have been incorporated to an average hydroxyl group content of 2–3 per molecule.

The polyisocyanate may be any commercially available polyisocyanate useful for making film-forming polyurethanes. 4,4'-Diphenylmethane diisocyanate is preferably used but other diisocyanates, such as tolylene diisocyanate (2,4-,2,6- or any mixture) and hexamethylene diisocyanate, can also be used.

The polyurethane is made by mixing together the starting materials, preferably in stoichiometric proportions—relative to hydroxyl and isocyanate groups, or with a small excess up to 10% of isocyanate, and preferably in an appropriate solvent for the starting materials and the polyurethane, e.g. ethyl acetate. A catalyst, e.g. a tertiary amine such as triethylamine, should be included in the reaction mixture. The reaction takes place at ambient temperature and can if desired be hastened by moderate heating up to 50° C. The polymer solution obtained can be used as such for coating the support after appropriate dilution and addition of other ingredients of the coating composition.

The products Systems 3010, 4504, 4505, and 4506 of Imperial Chemical Industries Ltd. are examples of fluorinated polyurethanes useful in the invention.

The synthetic film-forming resin which may be included in the coating can be any synthetic resinous material capable of forming a, preferably hydrophobic, continuous and adherent layer on a suitable base sheet for the printing plate. Suitable resins are polyvinyl acetate, polyvinyl chloride, polyvinyl chloride/acetate copolymers, nitrocellulose, and polyvinyl butyral.

The fluorinated polyurethane and the non-fluorinated resin (when used) should be applied to the support sheet from a solution in a suitable solvent, e.g. methyl ethyl ketone, in a sufficient weight to give a durable layer, for example so as to give a layer weighing 5 to 15, and especially about 7, grams per sq.m. The proportion of the fluorinated polyurethane is preferably 0.5 to 15%, and especially 1 to 6%, by weight of the coating.

Preferably, the resin/fluoro-compound layer is coated onto a paper support sheet which preferably consists of a sheet of dense highly calendered Kraft paper provided with a layer which does not absorb the solvent used in the coating of the resin/fluoro-compound. A suitable coating for the paper base is made by coating a dispersion of china clay in aqueous casein solution and drying. Sodium carboxymethylcellulose may be used in place of casein. The coatings may be applied to the paper or other base in known manner using conventional coating equipment.

Plates made in this manner may be imaged in the same way as the previously proposed plates having ink repellent surfaces and designed to be used without fountain solution. They are particularly suitable for imaging by an electrophotographic method in which a toner is applied to the surface of the plate by a xerographic method and then fused to cause it to adhere to the plate. Because of the lack of affinity between the surface of the plate and oleophilic materials, it is important that the fusion should be carried out in such a manner as to ensure good fixing of the fused image onto the plate. Thus, it is better to fuse the toner by application of a heated roller to the plate rather than by placing the plate in an oven.

In subsequent use, the plate may be used in the same way as the previously proposed planographic printing plates designed to be used without fountain solution. The ink used may be any ink formulated for use in a fountain-free system but it is especially advantageous to use in the planographic printing process an ink of the kind described in our application No. 837,863, now U.S. Pat. No. 4,148,767. Such inks have especially low affinity for the non-image areas of a printing plate prepared in the manner described above, combined with good adhesion to the image areas, thus ensuring that good quality copies are obtained.

The following Examples illustrate the invention.

EXAMPLE 1

A sheet of paper weighing 102 g/m$^2$ was coated in conventional manner with a suspension of china clay (90 g) in a solution of casein (as the ammonium salt, 20 g) in water (500 g), and then dried to give a coating weighing 14 g/m$^2$. The dried sheet was then coated with a solution containing polyvinyl acetate (Gelva 25) 2 parts by weight, System 4504 (a fluorinated polyurethane prepared as described below) 0.1 part by weight, and methyl ethyl ketone 8 parts by weight, to give a coating which after drying weighed 7 g/m$^2$. The planographic printing plate obtained had a strongly oleophobic surface ready for imaging.

The fluorinated polyurethane System 4504 was prepared as follows:

The compound of formula:

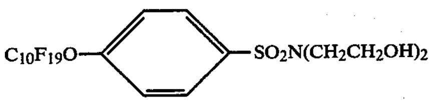

(prepared from diethanolamine and p-$C_{10}F_{19}O$-benzenesulphonyl chloride, 44.4 g, 0.006M), Ethomeen (i.e. $C_{12}H_{25}N(CH_2CH_2OH)_2$, 6 g, 0.019 M), Arco CS 15 (a styrene:butadiene copolymer polyol containing an average of 2.4 hydroxyl groups per molecule and having 25% of styrene residues and 75% of butadiene residues, the butadiene units being 60% trans-1,4, 20% cis-1,4, and 20% 1,2; 3.1 g, 0.001 M), triethylamine (2.5 ml), 4,4'-diphenylmethane diisocyanate (20 g, 0.08 M), and ethyl acetate (250 ml) were reacted together by adding the diisocyanate in 150 ml of the ethyl acetate drop-by-drop to the polyols and the triethylamine in the remainder of the ethyl acetate, while the reaction temperature is kept below 50° C. After completion of the addition, the reaction mixture was stirred at about 45° C. for 2 hours. The solution was cooled, filtered, analysed for solids content by evaporation, and diluted to 20% solids.

System 3010 is similar but contains no CS 15. Systems 4505 and 4506 contain 0.005 and 0.02 M of CS 15 respectively with corresponding adjustments in the amount of Ethomeen. All three give similar results to System 4504.

EXAMPLE 2

System 4504 (20% solids)—30%
Ethyl acetate—70%

This was coated onto a paper base of 102 gm$^{-2}$ weight which had been pre-coated as described in Example 1. The fluorochemical solution gave a coating weight of 7 gm$^{-2}$.

This plate, after imaging on a Gestetner FB 12 copier was run on a conventional Gestetner offset machine using an ink formulated for fountain-free printing, e.g. an ink of our copending Application referred to above, to give acceptable background-free copies.

Basically similar results were obtained with System 4505, System 4506 and System 3010 materials when used in the same manner.

EXAMPLES 3 TO 6

| | 3 | 4 | 5 | 6 |
|---|---|---|---|---|
| Elvacite 2009* | 27.0% | 27.0% | 27% | 27% |
| Toluene | 17.0 | 16.0 | 15 | 14 |
| Methyl ethyl ketone | 51.0 | 47.0 | 43 | 39 |
| System 4504 (20% solids) | 5.0 | 10.0 | 15 | 20 |
| Elvacite/System 4504 ratio | 18 | 8.2 | 5.4 | 4.1 |

*Elvacite is a methyl methacrylate polymer of Du Pont

The percentages are by weight. All examples were coated on the paper base described in Example 1, to a coating weight of 10–20 gm$^{-2}$. When printed under the previously mentioned conditions, Examples 4, 5 and 6 gave in excess of 200 clean, background-free copies. Example 3 gave only 50 copies before background printing became unacceptable.

Comparable results can be obtained with Systems 4505 and 4506.

As an alternative to Elvacite it is possible to use Butvar, as follows:

EXAMPLES 7 TO 10

| | 7 % | 8 % | 9 % | 10 % |
|---|---|---|---|---|
| Butvar B 70** | 17.8 | 17.8 | 17.8 | 17.8 |
| Methyl ethyl ketone | 78.9 | 77.0 | 72.2 | 64.2 |
| System 4504 | 3.3 | 5.2 | 10.0 | 13.0 |
| Butvar/System 4504 ratio | 16 | 10.3 | 5.4 | 4.1 |

*Butvar is a vinyl butyral polymer of Monsanto.

All examples were coated, on the paper base described in Example 1 to a constant coating weight of 10–20 $gm^{-2}$. These coatings yielded in excess of 200 clean background-free copies.

Comparable results can be obtained with Systems 4505 and 4506.

Alternative polymers that can be used are:

(a)—Polyvinyl acetate, e.g. Mowolith 20 or Gelva 25.

(b)—PVC and its copolymers, e.g. vinylite VYNS.

In addition these plate examples have been imaged on the Sharpfax SF 710 and Toshibafax BD-702A machines with comparable results to those produced in the Gestetner FG12.

We claim:

1. A planographic printing plate comprising a support sheet having an ink-repellent coating containing 0.5 to 15%, by weight of the said coating, of a fluorinated polyurethane obtained by reaction of a fluorinated polyol and a non-fluorinated polyol with a polyisocyanate, and the balance to 100% of a non-fluorinated film-forming synthetic resinous material.

2. A plate according to claim 1 in which the said coating contains 1 to 6% by weight of the said polyurethane.

3. A plate according to claim 1 in which the said non-fluorinated synthetic resinous material is polyvinyl acetate, polyvinyl chloride, polyvinyl chloride/acetate copolymer, nitrocellulose, or polyvinyl butyral.

4. A plate according to claim 1 in which the said coating weighs 5 to 15 grams per sq. meter.

5. A plate according to claim 1 in which the support sheet is a sheet of highly calendered Kraft paper carrying a layer of china clay dispersed in casein or sodium carboxymethylcellulose.

6. A plate according to claim 1 in which the polyurethane also contains radicals imparting affinity for the toner image.

7. A plate according to claim 6 in which the said radicals are styrene residues.

8. A plate according to claim 1 in which the said polyurethane contains residues in approximately stoichiometric proportions of (1) a polyol component comprising 50 to 90% by weight of a fluoro-compound of the formula:

$$R_f—(CH_2)_m—(OC_6H_4)_n—A—n(RX)_2$$

in which $R_f$ is a perfluoroaliphatic radical of at least 3 carbon atoms, m is 0, 1, or 2, n is 0 or 1, A is $—SO_2—$ or —CO—, R is alkylene of 2 to 10 carbon atoms, and X is —OH or $—NH_2$ and 50 to 10% by weight of a non-fluorinated polyol, and (2) a polyisocyanate.

9. A plate according to claim 8 in which, in the said fluoro-compound, $R_f$ is perfluoroalkenyl of 8, 10, 12, 14, or 16 carbon atoms, m is 0, n is 1, A is $—SO_2—$, R is ethylene, and X is OH.

10. A plate according to claim 8 in which, in the said fluoro-compound, $R_f$ is perfluoroalkyl of 3 to 15 carbon atoms, m is 0, n is 0, A is $—SO_2—$, R is alkylene of 2 to 4 carbon atoms, and X is —OH or $—NH_2$.

11. A plate according to claim 8 in which the said polyisocyanate is 4,4′-diphenylmethane diisocyanate or tolylene diisocyanate.

12. A plate according to claim 8 in which the said non-fluorinated polyol contains a styrene copolymer polyol.

13. A plate according to claim 12 in which the said non-fluorinated polyol is a mixture of a diol of formula:

$$R_1—N(CH_2CH_2OH)_2$$

where $R_1$ is alkyl of 8 to 18 carbon atoms and a styrene-butadiene copolymer polyol.

* * * * *